(12) United States Patent
Chan et al.

(10) Patent No.: US 12,230,524 B2
(45) Date of Patent: Feb. 18, 2025

(54) CONTROL SYSTEM FOR WAFER TRANSPORT VEHICLE AND METHOD FOR OPERATING THE SAME

(71) Applicant: TAIWAN SEMICONDUCTOR MANUFACTURING COMPANY LTD., Hsinchu (TW)

(72) Inventors: Kai Ping Chan, Taichung (TW); Yen-Yu Chen, Taichung (TW); Yen Le Lee, Taichung (TW); Ho Yueh Chen, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 607 days.

(21) Appl. No.: 17/213,916

(22) Filed: Mar. 26, 2021

(65) Prior Publication Data

US 2022/0310430 A1 Sep. 29, 2022

(51) Int. Cl.
*H01L 21/67* (2006.01)
*B60H 1/00* (2006.01)
*H01L 21/677* (2006.01)

(52) U.S. Cl.
CPC ... *H01L 21/67703* (2013.01); *B60H 1/00014* (2013.01); *B60H 1/00785* (2013.01); *H01L 21/67294* (2013.01); *H01L 21/6776* (2013.01)

(58) Field of Classification Search
USPC .................................................. 454/69–165
See application file for complete search history.

(56) References Cited

U.S. PATENT DOCUMENTS

| | | | | |
|---|---|---|---|---|
| 4,500,479 A | * | 2/1985 | Fukami | B01F 23/215 261/DIG. 4 |
| 11,787,260 B2 | * | 10/2023 | Faust | B60H 1/00842 454/75 |
| 2007/0015451 A1 | * | 1/2007 | McGrath | B60H 1/00742 340/425.5 |
| 2010/0170277 A1 | * | 7/2010 | Schmitt | H05K 7/20745 165/104.34 |
| 2018/0001734 A1 | * | 1/2018 | Faust | B60H 1/00742 |
| 2018/0202442 A1 | * | 7/2018 | Nakamoto | H02P 6/30 |
| 2020/0282806 A1 | * | 9/2020 | Sharma | B60H 1/00907 |

(Continued)

*Primary Examiner* — Ko-Wei Lin
(74) *Attorney, Agent, or Firm* — WPAT LAW; Anthony King

(57) ABSTRACT

A control system for a wafer transport vehicle is provided. The control system includes a control apparatus, a database, an onboard interface of the wafer transport vehicle and an operation control center. The control apparatus is arranged in a container of the wafer transport vehicle and configured to detect a environmental parameters in a container of the wafer transport vehicle and regulate the internal environment of a container of the wafer transport vehicle. The database is in communication with the control apparatus and configured store the environmental parameters detected by the control apparatus. The onboard interface is in communication with the control apparatus and configured to remotely control the control apparatus. The operation control center is in communication with the control apparatus and the onboard interface of the wafer transport vehicle and configured to receive the environmental parameters detected by the control apparatus.

20 Claims, 8 Drawing Sheets

(56) References Cited

U.S. PATENT DOCUMENTS

2020/0290431 A1\* 9/2020 Aikawa ................ B60H 1/3228
2020/0338955 A1\* 10/2020 Lee .................... B60H 1/00278
2020/0372315 A1\* 11/2020 Jablonski ................ G01S 11/04
2021/0323380 A1\* 10/2021 Ishizeki ............. B60H 1/00921
2022/0194228 A1\* 6/2022 Salter ................ B60H 1/00978

\* cited by examiner

CONTROL SYSTEM FOR WAFER TRANSPORT VEHICLE AND METHOD FOR OPERATING THE SAME

BACKGROUND

When wafers as products need to be transported from one semiconductor fabrication facility to another semiconductor fabrication facility, they are accommodated for each plural number into a wafer carrier. Further, the wafer carriers are loaded into a container of a wafer transport vehicle, and then the wafer transport vehicle carries the wafer carriers from one semiconductor fabrication facility to another semiconductor fabrication facility. Therefore, the internal environment of the container of the wafer transport vehicle should be adopted for receiving the wafers. Thus, a system that is able to monitor and control the internal environment of the container of the wafer transport vehicle in order to keep the internal environment of the container stable is necessary.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
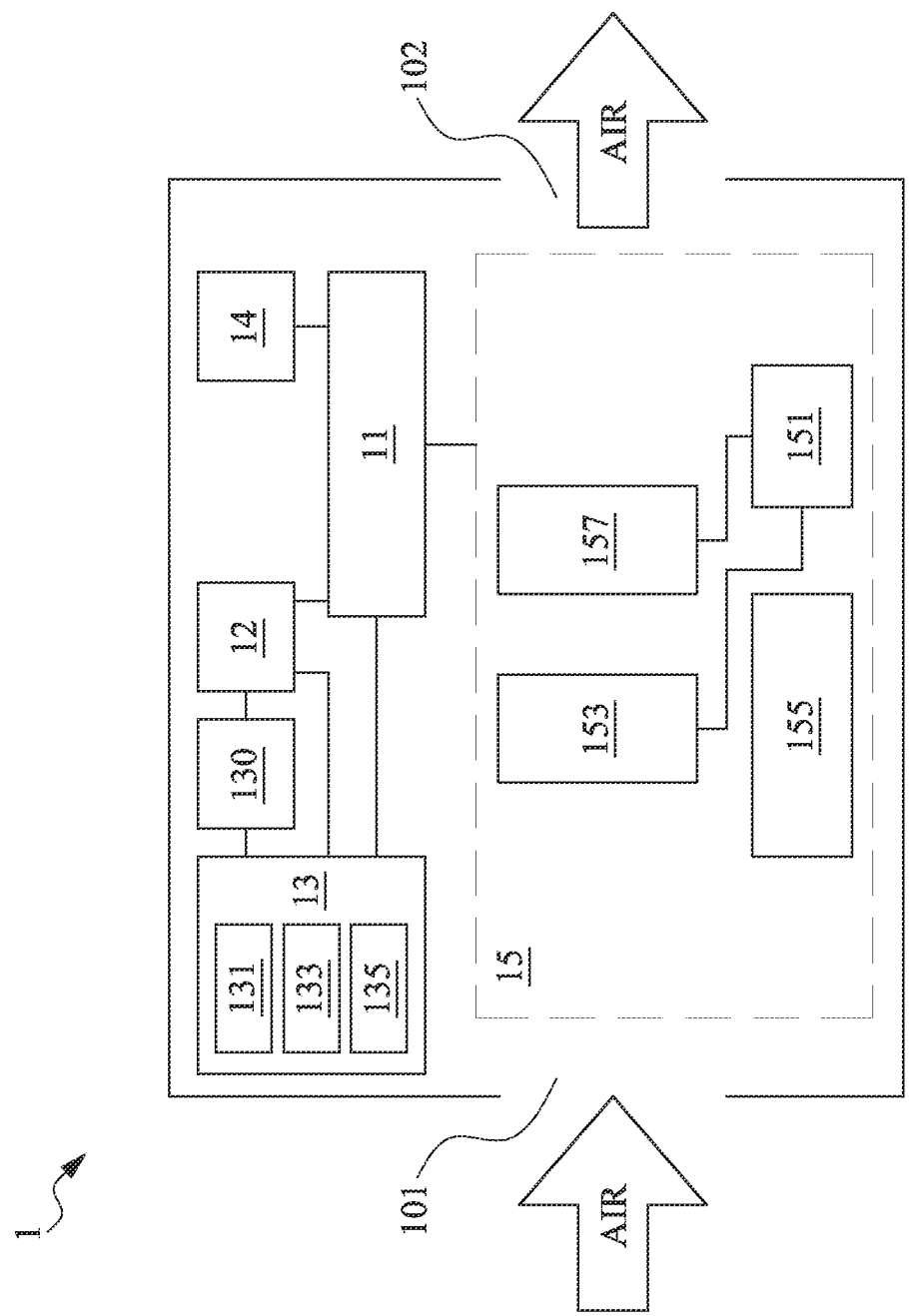
FIG. 1 is a block diagram of the control apparatus for the wafer transport vehicle, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

During production, customized parts, such as wafers, may be transported from one semiconductor fabrication facility to another semiconductor fabrication facility by a wafer transport vehicle. When the wafers are transported from one semiconductor fabrication facility to another semiconductor fabrication facility, the wafers are accommodated into the wafer carriers, and then the wafer carriers are loaded into the container of the wafer transport vehicle. In some embodiments, the wafer carrier is a wafer pod, a front opening unified pod (FOUP), a wafer lot, a wafer cassette, or a wafer boat. After the wafer carriers are loaded into the container of the wafer transport vehicle, the wafer transport vehicle carries the wafers from one semiconductor fabrication facility to another semiconductor fabrication facility.

Present disclosure provides a control apparatus and a control system for a wafer transport vehicle that monitor the internal environment of the container which be loaded with the wafer carriers and keep the internal environment of the container stable in real time. The control system includes a control apparatus configured to collect the conditions of the internal environment of the container and regulate the internal environment of the container.

FIG. 1 is a block diagram of the control apparatus 1 for the wafer transport vehicle, in accordance with some embodiments of the present disclosure. The control apparatus 1 is configured to be arranged in the container loaded with the wafer carriers. As shown in FIG. 1, the control apparatus 1 includes a main body 10, a control module 11, a wireless communication module 12, a sensor module 13, a warning device 14 and an environmental regulator assembly 15. The control module 11, the wireless communication module 12, the sensor module 13, the warning device 14 and the environmental regulator assembly 15 may be arranged within the main body 10. Referring to FIG. 1, the sensor module 13, the wireless communication module 12, the warning device 14 and the environmental regulator assembly 15 may connect to the control module 11, and the sensor module 13 may connect to the wireless communication module 12.

As shown in FIG. 1, the control module 11 may connect to the sensor module 13, the wireless communication module 12, the warning device 14 and the environmental regulator assembly 15. In some embodiments of the present disclosure, the control module 11 may be a collection of sensors, actuators, other control modules and associated processing equipment, which is operated as a single entity. The control module 11 connects to the wireless communication module 12 and be configured to receive the information and/or instruction from the wireless communication module 12. The control module 11 connects to the sensor module 13 and be configured to receive the information from the sensor module 13. The control module 11 connects to the warning device 14 and be configured to actuate and/or control the warning device 14 based on the information and/or instruction from the wireless communication module 12 and/or the sensor module 13. For example, an external user can send an instruction to the control module 11 through the wireless communication module 12 so as to actuate the warning device 14. Further, for example, the control module 11 can automatically actuate the warning device 14 while receiving the information from the sensor module 13. The control module 11 connects to the environmental regulator assembly 15 and be configured to actuate and/or control the environmental regulator assembly 15 based on the information and/or instruction from the wireless communication module 12 and/or the sensor module. For example, an external user can send an instruction to the control module 11 through the wireless communication module 12 to actuate and/or control the environmental regulator assembly 15. Further, for example, the control module 11 can automatically actuate and/or control the environmental regulator assembly 15 based on the information from the sensor module 13.

In some embodiments of the present disclosure, the wireless communication module 12 includes a Wi-Fi module, WLAN module, 3G/4G/5G module and/or GPS module. The wireless communication module 12 connects to the control module 11 and be configured to receive the instruction and/or information from the external user and transmit such instruction and/or information to the control module 11. The wireless communication module 12 connects to the sensor module 13 and be configured to receive the data and/or information from the sensor module 13 and upload such data and/or information to the external database and/or transmit such data and/or information to the external user.

The sensor module 13 is configured to detect environmental parameters in the container of the wafer transport vehicle. In some embodiments of the present disclosure, the sensor module 13 includes a temperature sensor 131 configured to detect the temperature in the container of the wafer transport vehicle. In some embodiments of the present disclosure, the sensor module 13 includes a humidity sensor 133 configured to detect the humidity level in the container of the wafer transport vehicle. In some embodiments of the present disclosure, the sensor module 13 includes a vibration sensor 135 configured to detect the vibration of the container of the wafer transport vehicle. Referring to FIG. 1, the sensor module 13 connects to the wireless communication module 12. The sensor module 13 may transmit the environmental parameters detected by the sensor module 13 to the external user through the wireless communication module 12. Moreover, in some embodiments of the present disclosure, the sensor module 13 may connect to the control unit 11. The control unit 11 is configured to receive the information and/or data from the sensor module 13 and actuate and/or control the warning device 14 and/or the environmental regulator assembly 15 based on such information and/or data. For example, if the control module 11 receives the data related to the abnormal vibration from the vibration sensor 135 of the sensor module 13, the control module 11 actuates and/or controls the warning device 14 to remind the driver of the wafer transport vehicle. For example, if the control module 11 receives the data related to the abnormal temperature and/or humidity level from the sensor module 13, the control module 11 actuates and/or controls the environmental regulator assembly 15 to regulate and adjust the internal environment of the carrier of the wafer transport vehicle.

In some embodiments of the present disclosure, the control apparatus 1 further includes a memory module 130, which is configured to receive and store the environmental parameters detected by the sensor module 13 The memory module 130 may upload the environmental parameters stored in the memory module 130 to the external database through the wireless communication module 12.

Referring to FIG. 1, the warning device 14 connects to the control module 11 and be configured to be actuated by the control module 11. In some embodiments of the present disclosure, the warning device 14 includes a buzzer. When the vibration sensor 135 detects an abnormal vibration, the sensor module 13 may send information to the control module 11. Then the control module 11 actuates the buzzer of the warning device 14 to alert the driver of the wafer transport vehicle. In some embodiments of the present disclosure, the external user can remotely actuate or control the warning device 14 through the wireless communication module 12 and the control module 11.

In some embodiments of the present disclosure, the environmental regulator assembly 15 includes an air conditioner. Further, the air conditioner may include a compressor 151, a cooling element 153 connecting to the compressor 151, a heating element 157 connecting to the compressor 151, a water tank 155, an air inlet 101 and an air outlet 102. The air inlet 101 and the air outlet 102 are in fluid communication with the outside of the control apparatus 1. The air inlet 101 is configured to draw the air from the outside of the control apparatus 1 into the inside of the control apparatus 1. The air drawn from the air inlet 101 passes through the cooling element 153 and may be cooled well below its dew point. The humidity in the air may condense on the surface of the cooling element 153 and may drip into the water tank 155 or may be led directly to a drain. Then, the air continues through the heating element 157 which heat it up. Further, the air outlet 102 is configured to exhaust the air to the outside of the control apparatus 1. Referring to FIG. 1, the environmental regulator assembly 15 connects to the control module 11 and is actuated and controlled by the control module 11. In some embodiments of the present disclosure, when the sensor module 13 detects the abnormal temperature and/or the abnormal humidity in the container of the wafer transport vehicle, the sensor module 13 will send such information to the control module 11, and then the control module 11 will actuate and control the environmental regulator assembly 15 to regulate the internal environment of the container of the wafer transport vehicle. In some embodiments of the present disclosure, the external user can remotely actuate and/or control the environmental regulator assembly 15 through the wireless communication module 12 and the control module 11.

Figure 2A:
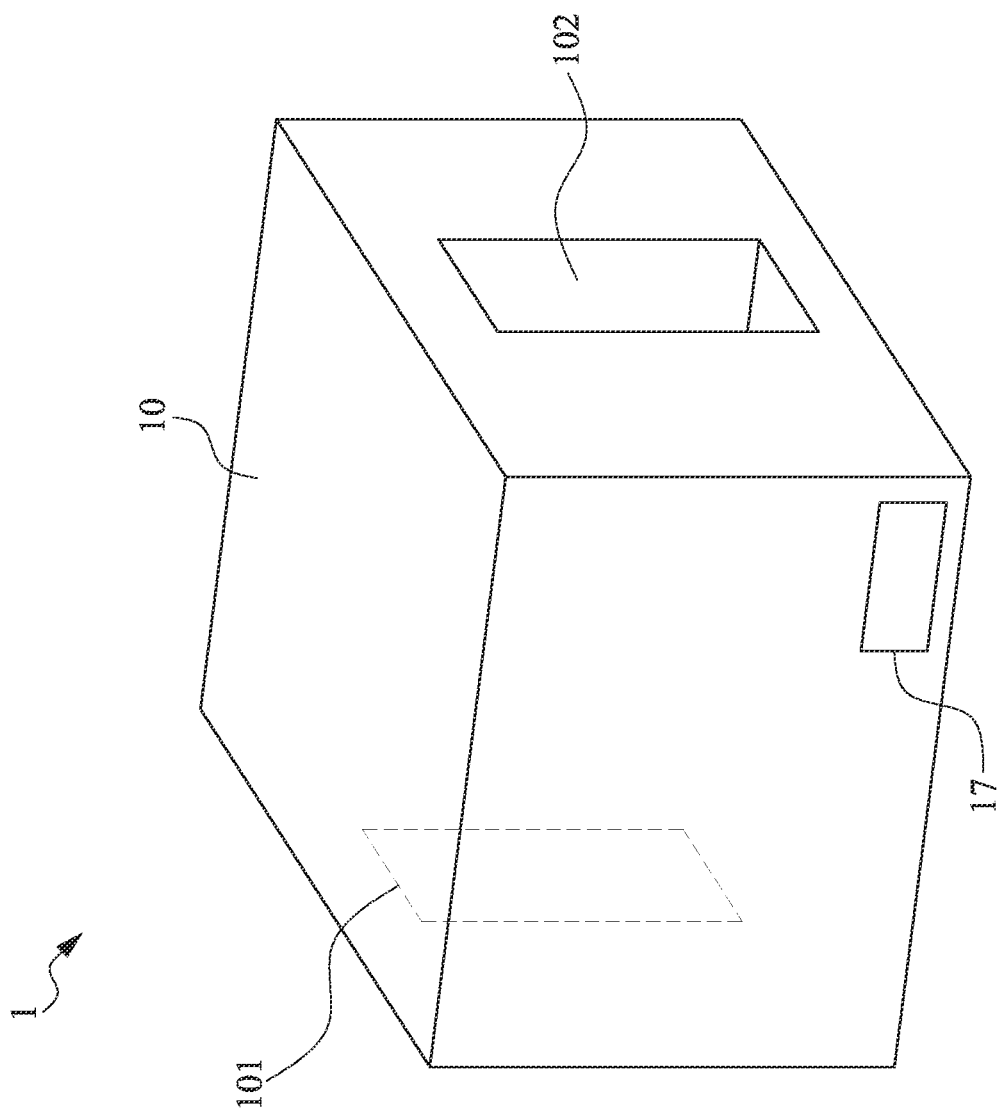
FIG. 2A is a perspective view of the control apparatus for the wafer transport vehicle, in accordance with some embodiments of the present disclosure.
Figure 2B:
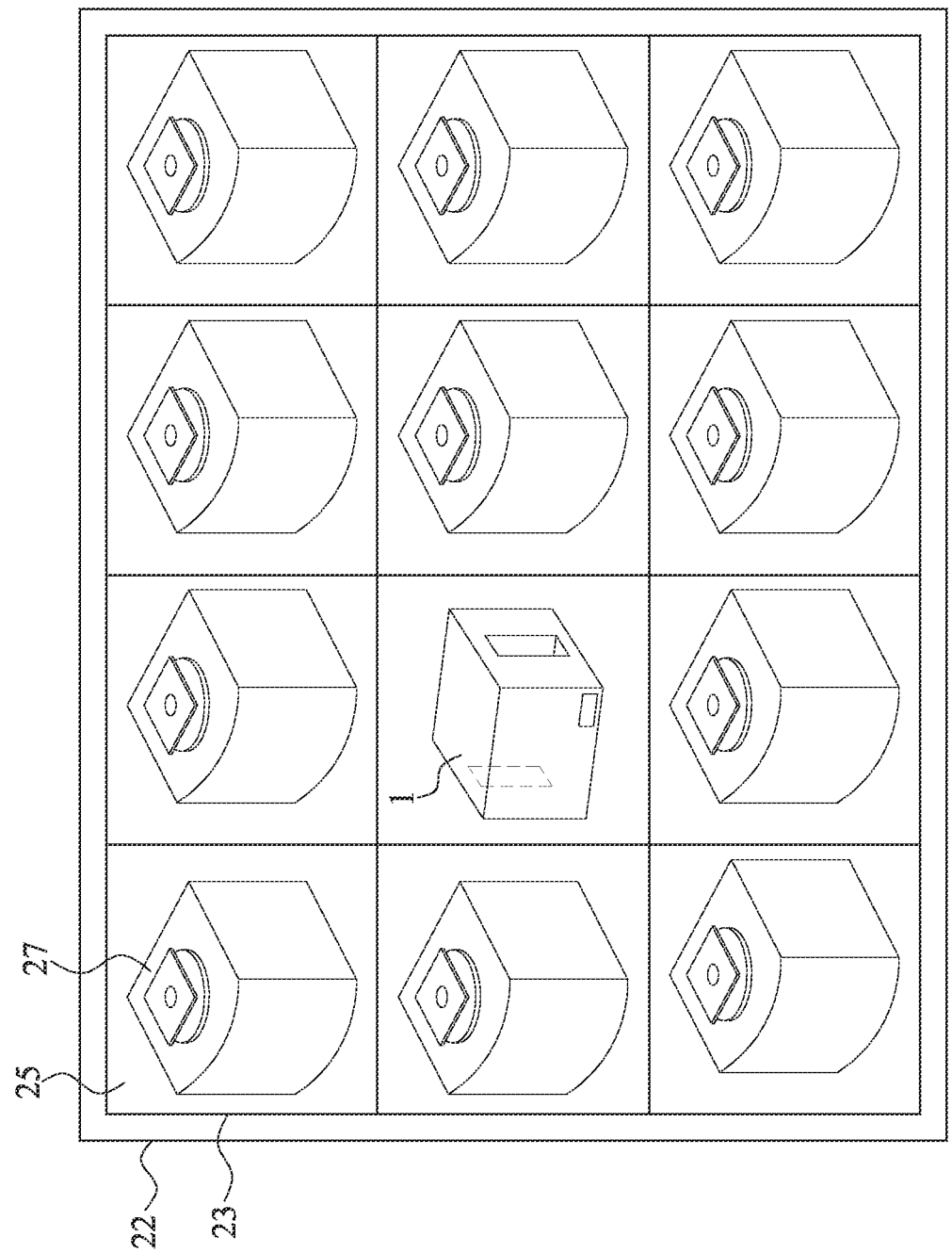
FIG. 2B shows the control apparatus arranged in the container of the wafer transport vehicle.

FIG. 2A is a perspective view of the control apparatus 1 for the wafer transport vehicle, in accordance with some embodiments of the present disclosure. In some embodiments of the present disclosure, the main body 10 of the control apparatus 1 is configured to be cubic. As shown in FIG. 2B, the container 22 of the wafer transport vehicle may have a cabinet 23 with a number of the compartments 25, and the wafer carriers 27 are respectively received in the compartments 25 when the wafer carriers 27 are loaded into the container 22 of the wafer transport vehicle. The control apparatus 1 may be also received in the compartments 25 such that the control apparatus 1 could be arranged in the container 22 of the wafer transport vehicle and detects and controls the internal environment of the container 22 of the wafer transport vehicle. Therefore, in some embodiments of the present disclosure, the shape of the main body 10 of the control apparatus 1 is configured to be the same as, or similar to the shape of the wafer carrier 27. In some embodiment of the present disclosure, the size of the control apparatus 1 is substantially equal to or smaller than the size of the wafer carrier 27. For example, the size of the control apparatus 1 is substantially equal to 300 mm*300 mm*300 mm, and the size of the control apparatus 1 is substantially equal to or smaller than 300 mm*300 mm*300 mm.

Referring to FIG. 2A, the control apparatus 1 may include a tag 17 mounted on the outer surface of the main body 10. The tag 17 may have a memory which includes a plurality of pages storing the information. A reader reads information relating to and identifying the control apparatus 1 from the tag 17. In some embodiments of the present disclosure, the tag 17 includes an RFID tag. In a conventional fab, a wafer carrier is equipped with a smart tag storing information pertaining to the carrier (such as carrier identification number and carrier clean due date), wafers loaded therein (such as lot number), and process for the loaded wafers (such as recipe information). Information stored in a smart tag is retrieved by a tag reader. In some embodiments of the present disclosure, the tag 17 of the control apparatus 1 is the same as, or similar to, the smart tag equipped with the wafer carrier.

Figure 3:
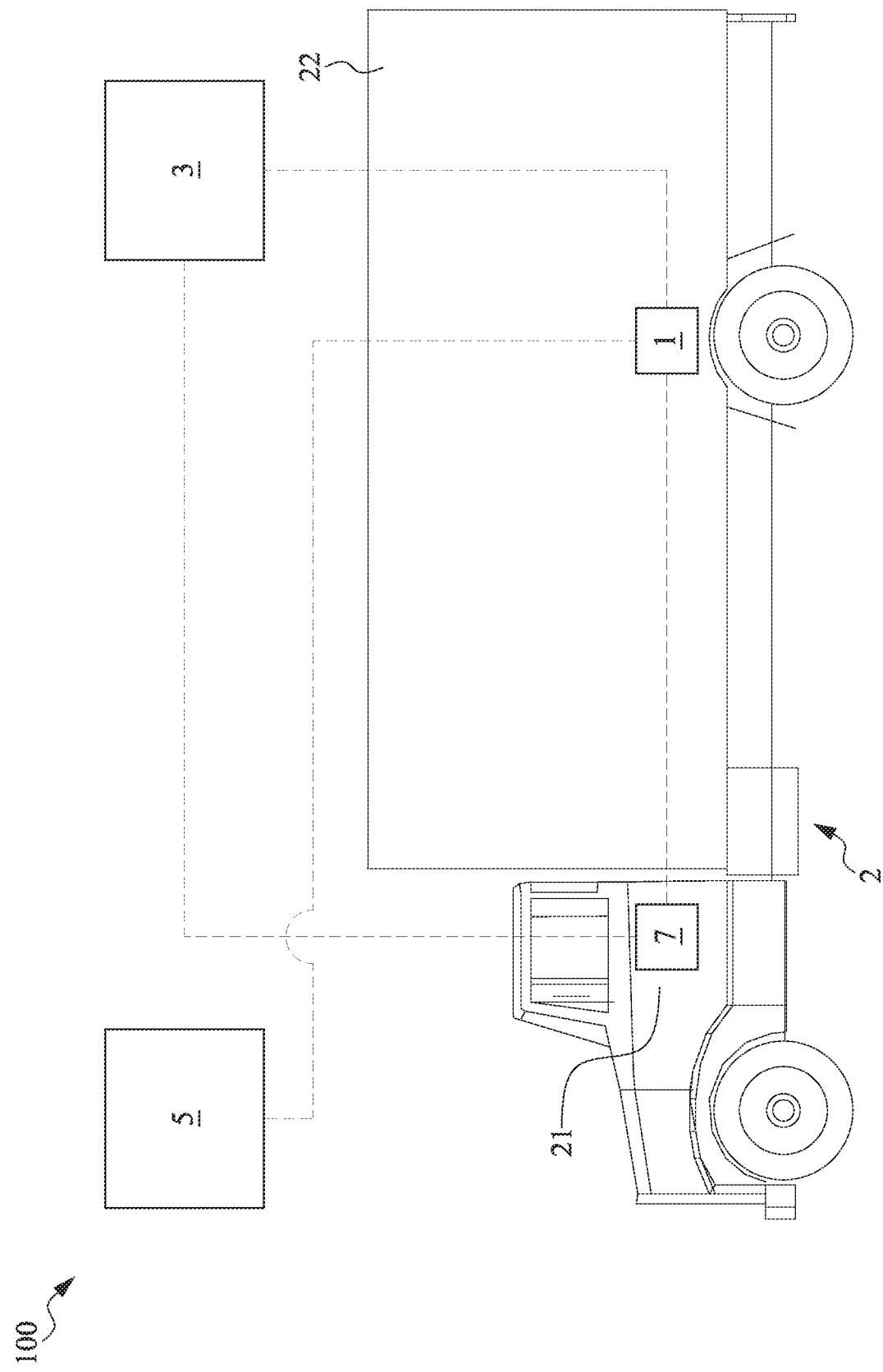
FIG. 3 is a block diagram of the control system for the wafer transport vehicle, in accordance with some embodiments of the present disclosure.

FIG. 3 is a block diagram of the control system 100 for the wafer transport vehicle 2, in accordance with some embodiments of the present disclosure. In some embodiments of the present disclosure, the control system 100 includes a control apparatus 1, an operation control center 3 (OCC), an external database 5 and an onboard interface 7 of the wafer transport vehicle 2. The control apparatus 1 may be the same as the control apparatus 1 shown in FIGS. 1 and 2A. As shown in FIG. 3, the control apparatus 1 may be arranged within the container 22 of the wafer transport vehicle 2. The control apparatus 1 is configured to detect and control the internal environment of the container 22 of the wafer transport vehicle 2. In some embodiments of the present disclosure, the control apparatus 1 may be in communication with the operation control center 3 by the wireless communication module 12. Thus, the control apparatus 1 may transmit the information and/or data to the operation control center 3 and may receive the instruction from the operation control center 3. In some embodiments of the present disclosure, the control apparatus 1 may be in communication with the external database 5 by the wireless communication module 12. Thus, the control apparatus 1 may transmit the information and/or data to the external database 5. In some embodiments of the present disclosure, the control apparatus 1 may be in communication with the onboard interface 7 by the wireless communication module 12. Thus, the control apparatus 1 may transmit the information and/or data to the onboard interface 7 and may receive the instruction from the onboard interface 7.

The operation control center 3 is configured to monitor and regulate the internal environment of the container 22 of the wafer transport vehicle 2 by the control apparatus 1. In some embodiments of the present disclosure, the operation control center 3 may be in communication with the control apparatus 1 directly. In some embodiments of the present disclosure, the operation control center 3 is in communication with the control apparatus 1 through the onboard interface 7. The operation control center 3 is configured to receive the environmental parameters from the sensor module 13 of the control apparatus 1 such that the operation control center 3 could monitor the status of the internal environment of the container 22 of the wafer transport vehicle 2. Further, the operation control center 3 is configured to remotely control the control apparatus 1 so as to keep the internal environment of the container 22 of the wafer transport vehicle 2 to be stable. For example, when the operation control center 3 finds that the vibration of the container 22 is abnormal by the data transmitted from the control apparatus 1, the operation control center 3 could remotely actuate the warning device 14 of the control apparatus 1 so as to remind the driver of the wafer transport vehicle 2. Moreover, for example, when the operation control center 3 finds that the temperature in the container 22 is too high by the data transmitted from the control apparatus 1, the operation control center 3 could remotely actuate and/or control the environmental regulator assembly 15 of the control apparatus 1 so as to lower the temperature in the container 22. Moreover, for example, when the operation control center 3 finds that the humidity level in the container 22 is too high by the data transmitted from the control apparatus 1, the operation control center 3 could remotely actuate and/or control the environmental regulator assembly 15 of the control apparatus 1 to dehumidify the internal environment of the container 22.

Referring to FIG. 3, the external database 5 may be in communication with the control apparatus 1. In some embodiments of the present disclosure, the control apparatus 1 is configured to transmit the environmental parameters detected by the sensor module 13 to the external database 5 in real-time. In some embodiments of the present disclosure, the environmental parameters detected by the sensor module 13 could be stored in the memory module 130, and then the control apparatus 1 uploads the stored environmental parameters from the memory module 130 to the external database 5 when the control apparatus 1 connects to the external database 5. In some embodiments of the present disclosure, the external database 5 includes a statistical process control (SPC) system.

The onboard interface 7 may be arranged adjacent to the operator seat 21 of the wafer transport vehicle 2 such that the driver of the wafer transport vehicle 2 can easily use the onboard interface 7. As shown in FIG. 3, the onboard interface 7 may be in communication with the operation control center 3 such that the driver of the wafer transport vehicle 2 can communicate to the operation control center 3 by the onboard interface 7. In addition, the onboard interface 7 is configured to be received the information transmitted from the operation control center 3. Further, the onboard interface 7 may be in communication with the control apparatus 1 and the control apparatus 1 can transmit the information and/or data to the onboard interface 7. In addition, the driver can remotely control the control apparatus 1 by the onboard interface 7. For example, when the operation control center 3 finds that the vibration of the container 22 is abnormal by the data transmitted from the control apparatus 1, the operation control center 3 can give the driver notice by the onboard interface 7. Moreover, for example, when the operation control center 3 finds that the temperature in the container 22 is too high by the data transmitted from the control apparatus 1, the operation control center 3 can give the driver notice by the onboard interface 7 and then the driver can actuate and/or control the environmental regulator assembly 15 of the control apparatus 1 by the onboard interface 7 so as to lower the temperature in the container 22. Moreover, for example, when the operation control center 3 finds that the humidity level in the container 22 is too high by the data transmitted from the control apparatus 1, the operation control center 3 can give the driver notice by the onboard interface 7 and then the driver can actuate and/or control the environmental regulator assembly 15 of the control apparatus by the onboard interface 7 so as to dehumidify the internal environment of the container 22.

In some embodiments of the present disclosure, the wireless communication module 12 of the control apparatus 1 only includes a Wi-Fi module and the onboard interface 7 includes a WLAN module or a 3G/4G/5G module, and the control apparatus 1 is configured to communicate with the operation control center 3 through the onboard interface 7.

Figure 4:
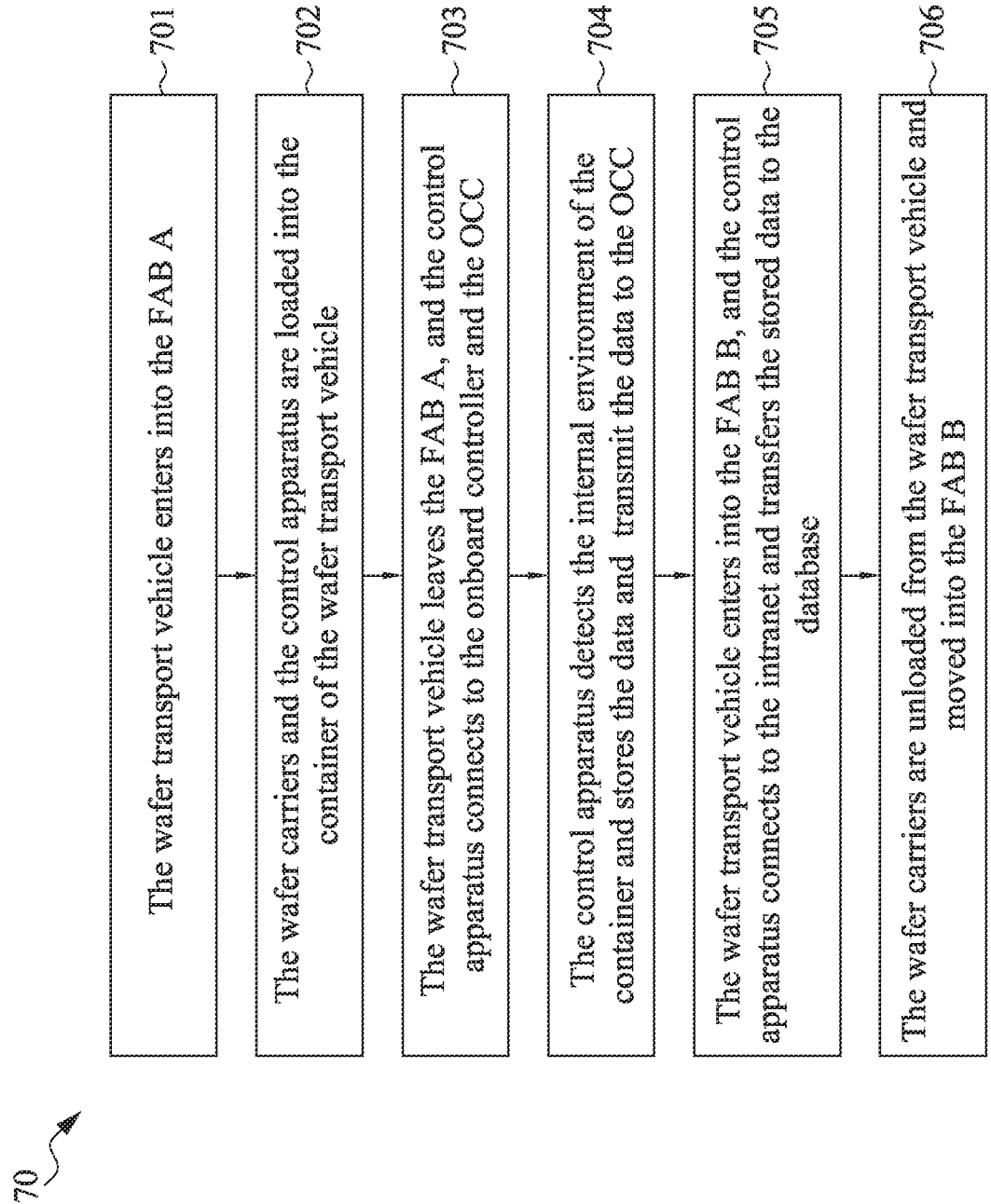
FIG. 4 is a flow chart representing exemplary operations of the method for operating the control system for the wafer transport vehicle, in accordance with some embodiments of the present disclosure.

FIG. 4 is a flow chart 70 representing exemplary operations of the method for operating the control system for the wafer transport vehicle, in accordance with some embodiments of the present disclosure. Especially, such operation is related to shipping the wafers from FAB A to FAB B by the wafer transport vehicle 2.

In Operation 701, the wafer transport vehicle 2 enters into the FAB A and is prepared to ship the wafers from the FAB A to FAB B.

In Operation 702, the wafers are received in the wafer carriers, and then the wafer carriers and the control apparatus 1 are loaded into the container 22 of the wafer transport vehicle 2. Before the control apparatus 1 is loaded into the container 22, the reader may scan the tag 17 of the control apparatus 1 to identify the control apparatus 1. Moreover, the reader may also scan the tags on the wafer carriers before the wafer carriers are loaded into the container 22.

In Operation 703, the wafer transport vehicle 2 leaves the FAB A and moves toward the FAB B. The control apparatus 1 may wirelessly connect to the onboard interface 7 of the wafer transport vehicle 2 and the operation control center 3. In some embodiments of the present disclosure, the control apparatus 1 is in communication with the operation control center 3 directly. In some embodiments of the present disclosure, the control apparatus 1 is in communication with the operation control center 3 through the onboard interface 7.

In Operation 704, on the way to the FAB B, the sensor module 13 of the control apparatus 1 may detect the environmental parameters in the container 22. The temperature sensor 131 of the sensor module 13 is configured to detect the temperature in the container 2. The humidity sensor 133 of the sensor module 13 is configured to detect the humidity level in the container 22. The vibration sensor 135 of the sensor module 13 is configured to detect the vibration of the container 22. The environmental parameters detected by the sensor module 13 may be stored in the memory module 130. Moreover, the control apparatus 1 may transmit the environmental parameters detected by the sensor module 13 to the operation control center 3 such that the operation control center 3 can monitor the status of the internal environment of the container 22 of the wafer transport vehicle 2 in real time.

In Operation 705, the wafer transport vehicle 2 arrives in the FAB B. In the meantime, the control apparatus 1 may connect to the intranet of the FAB B and then the control apparatus 1 may automatically upload the environmental parameters stored in the memory module 130 to the external database 5.

In Operation 707, after the wafer transport vehicle 2 enters into the FAB B, the wafer carriers are unloaded from the container 22 of the wafer transport vehicle 2 and moved into the FAB B.

Figure 5A:
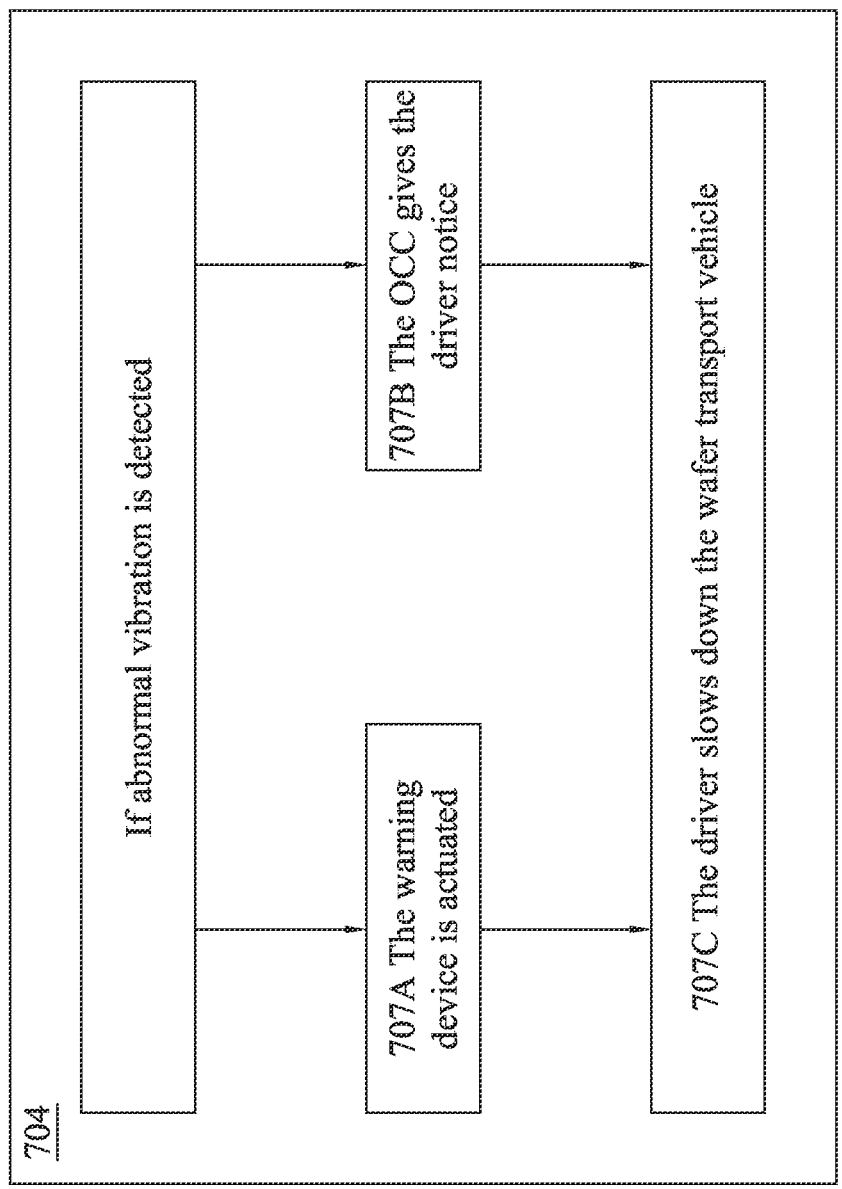
FIG. 5A is another flow chart representing exemplary operations of the method for operating the control system for the wafer transport vehicle, in accordance with some embodiments of the present disclosure.

Further, referring back to Operation 704, the sensor module 13 of the control apparatus 1 may detect the environmental parameters in the container 22 of the wafer transport vehicle 2 during shipping the wafers. Referring to FIG. 5A, if the sensor module 13 detects that the container 22 has the abnormal vibration, in some embodiments of the present disclosure, the sensor module 13 may automatically actuate the warning device 14 by the control module 11 so as to remind the driver of the wafer transport vehicle 2 (Operation 707A). Moreover, in some embodiments of the present disclosure, the operation control center 3 may communicate to the driver of the wafer transport vehicle 2 and give him/her notice when the operation control center 3 finds the abnormal vibration by the environment parameters transmitted from the control apparatus 1, and then the operation control center 3 (Operation 707B). The driver can slow down the wafer transport vehicle 2 and stabilize the container 22 of the wafer transport vehicle 2 after receiving the warning information from the warning device 14 or the notice from the operation control center 3.

Figure 5B:
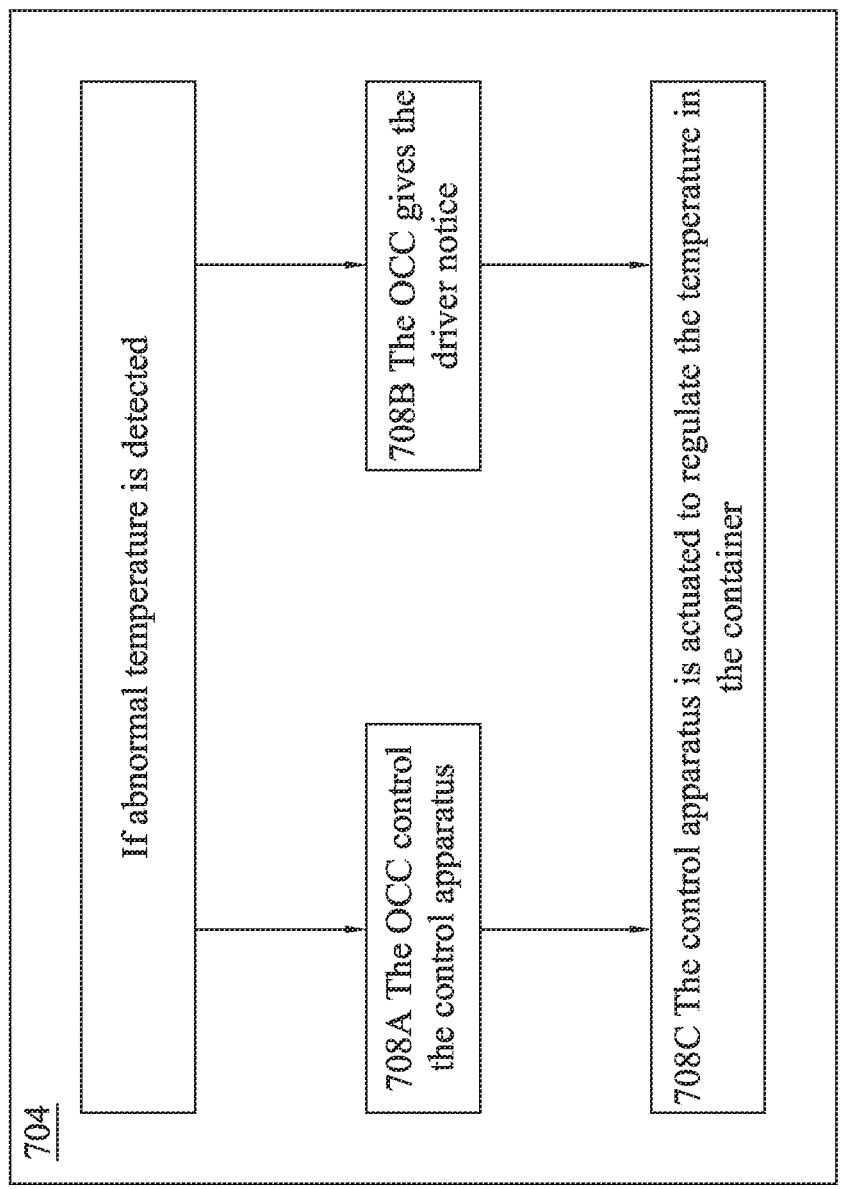
FIG. 5B is another flow chart representing exemplary operations of the method for operating the control system for the wafer transport vehicle, in accordance with some embodiments of the present disclosure.

Referring to FIG. 5B, when the operation control center 3 finds that the temperature in the container 22 is too high by the environmental parameters transmitted from the control apparatus 1, in some embodiments of the present disclosure, the operation control center 3 may remotely actuate and/or control the environmental regulator assembly 15 of the control apparatus 1 to lower the temperature in the container 22 (Operation 708A). In some embodiments of the present disclosure, the operation control center 3 may communicate to the driver of the wafer transport vehicle 2 and give him/her notice, and then the driver may actuate and/or control the environmental regulator assembly 15 of the control apparatus 1 by the onboard interface 7 to lower the temperature in the container 22 (Operation 708B). After the operation control center 3 or the driver actuates and/or controls the environmental regulator assembly 15 of the control apparatus 1, the temperature in the container 22 could be lowered by the environmental regulator assembly 15 of the control apparatus 1 (Operation 708C).

Figure 5C:
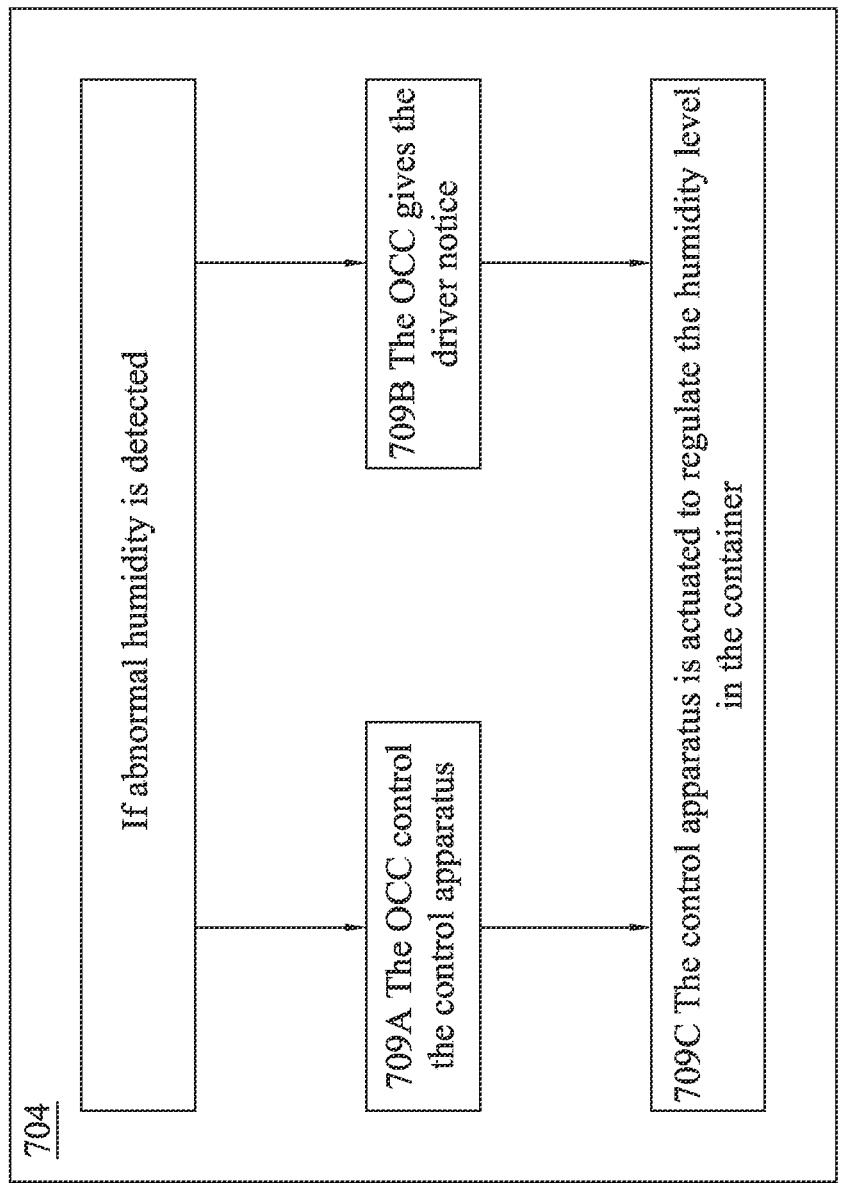
FIG. 5C is another flow chart representing exemplary operations of the method for operating the control system for the wafer transport vehicle, in accordance with some embodiments of the present disclosure.

Referring to FIG. 5C, when the operation control center 3 finds that the humidity level in the container 22 is too high by the environmental parameters transmitted from the control apparatus 1, in some embodiments of the present disclosure, the operation control center 3 may remotely actuate and/or control the environmental regulator assembly 15 of the control apparatus 1 to dry the internal environment of the container 22 (Operation 709A). Moreover, in some embodiments of the present disclosure, the operation control center 3 may communicate to the driver of the wafer transport vehicle 2 and give him/her notice, and then the driver may actuate and/or control the environmental regulator assembly 15 of the control apparatus 1 by the onboard interface 7 to dry the internal environment of the container 22 (Operation 709B). After the operation control center 3 or the driver actuates and/or controls the environmental regulator assembly 15 of the control apparatus 1, the internal environment of the container 22 could be dehumidified by the environmental regulator assembly 15 of the control apparatus 1 (Operation 709C).

It will be further appreciated that the foregoing apparatus and system may be used in the wafer transport vehicle for transporting the wafer carriers with the wafers from one semiconductor fabrication facility to another semiconductor fabrication facility. The foregoing apparatus and system may provide the user with the real-time information of the container which is loaded with the wafer carriers and keep the internal environment of the container stable. In addition, the foregoing apparatus and system may automatically upload the information of the container to the external database.

According to one embodiment of the present disclosure, a control apparatus for a wafer transport vehicle includes a sensor module, a wireless communication module, and a control module. The sensor module is configured to detect environmental parameters in a container of the wafer transport vehicle. The wireless communication module is configured to transmit the environmental parameters detected by the sensor module. The environmental regulator assembly is configured to regulate the internal environment of the container of the wafer transport vehicle. The control module is configured to control the environmental regulator assembly.

According to another embodiment, a control system for a wafer transport vehicle includes a control apparatus, a database, an onboard interface of the wafer transport vehicle and an operation control center. The control apparatus is arranged in a container of the wafer transport vehicle and configured to detect environmental parameters in a container of the wafer transport vehicle and regulate an internal environment of a container of the wafer transport vehicle. The database is in communication with the control apparatus and configured to store the environment parameters detected by the control apparatus. The onboard interface is in communication with the control apparatus and configured to remotely control the control apparatus. The operation control center is in communication with the control apparatus and the onboard interface of the wafer transport vehicle and configured to receive the environmental parameters detected by the control apparatus.

According to one embodiment of the present disclosure, a method for operating a control system for a wafer transport vehicle includes: detecting environmental parameters in a container of the wafer transport vehicle by a control apparatus arranged in the container of the wafer transport vehicle, transmitting environmental parameters detected by the control apparatus to an operation control center; and controlling the control apparatus to regulate an internal environment of the container of the wafer transport vehicle based on the environmental parameters detected by the control apparatus.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A control system, comprising:
    a control apparatus arranged in a container of a wafer transport vehicle and configured to detect environmental parameters in the container of the wafer transport vehicle and regulate an internal environment of the container of the wafer transport vehicle; wherein the container of the wafer transport vehicle comprises a cabinet with a plurality of compartments, and wherein each of the plurality of compartments has a space configured to receive a wafer carrier, and wherein the control apparatus is received in the space of one of the plurality of compartments;
    an onboard interface of the wafer transport vehicle in communication with the control apparatus; and
    an outboard controller outside the wafer transport vehicle and in communication with the control apparatus;
    wherein the onboard interface is configured to perform operations comprising:
    receiving an information from the control apparatus;
    providing communication with the outboard controller;
    receiving an information from the outboard controller; and
    controlling the control apparatus so as to regulate the internal environment of the container of the wafer transport vehicle;
    wherein the outboard controller is configured to perform operations comprising:
    receiving the environmental parameters detected by the control apparatus in the container of the wafer transport vehicle;
    monitoring the internal environment of the container of the wafer transport vehicle through the control apparatus;
    regulating the internal environment of the container of the wafer transport vehicle through the control apparatus; and
    providing a notice to a driver of the wafer transport vehicle through the onboard interface.

2. The control system of claim 1, wherein the control apparatus comprising:
    a sensor module configured to detect the environmental parameters in the container of the wafer transport vehicle;
    a wireless communication module configured to transmit the environmental parameters detected by the sensor module;
    an environmental regulator assembly configured to regulate the internal environment of the container of the wafer transport vehicle; and
    a control module configured to control the environmental regulator assembly.

3. The control system of claim 2, wherein the environmental regulator assembly comprises an air conditioner.

4. The control system of claim 2, wherein the sensor module is configured to detect a temperature in the container, a humidity level in the container or a vibration of the container.

5. The control system of claim 4, wherein the onboard interface is configured to control the control apparatus so as to regulate the temperature in the container and/or the humidity level in the container based on the temperature in the container and/or the humidity level in the container detected by the sensor.

6. The control system of claim 4, wherein, based on the temperature in the container and/or the humidity level in the container detected by the sensor, the outboard controller is configured to regulate the temperature in the container and/or the humidity level in the container through the control apparatus.

7. The control system of claim 1, wherein the onboard interface of the wafer transport vehicle is adjacent to an operator seat of the wafer transport vehicle.

8. The control system of claim 1, wherein the control apparatus comprises a tag at its outer surface and wherein the tag is configured to be scanned to provide an identification of the control apparatus, and wherein the tag is identical to a tag equipped with the wafer carrier.

9. The control system of claim 2, wherein the control apparatus further comprises a warning device configured to alert a driver of the wafer transport vehicle.

10. A method for operating a control system for a wafer transport vehicle, comprising:
loading one or more wafer carriers into one or more of compartments of a cabinet in a container of the wafer transport vehicle respectively, wherein the container is loaded onto a wafer transport vehicle;
loading a control apparatus into one of the compartments of the cabinet;
transporting the cabinet by the wafer transport vehicle;
detecting environmental parameters in the container of the wafer transport vehicle by the control apparatus;
operating an onboard interface of the wafer transport vehicle in communication with the control apparatus, and
operating an outboard controller outside the wafer transport vehicle in communication with the control apparatus;
wherein the step of operating the onboard interface further comprises:
receiving an information from the control apparatus;
providing communication with the outboard controller;
receiving an information from the outboard controller; and
controlling the control apparatus so as to regulate an internal environment of the container of the wafer transport vehicle;
wherein the step of operating the outboard controller further comprises:
receiving the environmental parameters detected by the control apparatus in the container of the wafer transport vehicle;
monitoring the internal environment of the container of the wafer transport vehicle through the control apparatus;
regulating the internal environment of the container of the wafer transport vehicle through the control apparatus; and
providing a notice to a driver of the wafer transport vehicle through the onboard interface.

11. The method of claim 10, wherein the step of detecting environmental parameters in the container of the wafer transport vehicle, the step of operating the onboard interface and the step of operating the outboard controller while transporting the cabinet in the wafer transport vehicle.

12. The method of claim 10, wherein the step of providing a notice to the driver of the wafer transport vehicle is performed while the control apparatus finds an abnormality, wherein the abnormality comprises one or more of: an abnormal vibration of the container, an abnormal temperature in the container and an abnormal humidity in the container.

13. The method of claim 12, further comprising: controlling the wafer transport vehicle by the driver and/or activating the control apparatus to eliminate the abnormality.

14. A system for a wafer transport vehicle, comprising:
a control apparatus located in a container of a wafer transport vehicle, the control apparatus configured to detect environmental parameters within the container and regulate an internal environment of the container, wherein the container comprises a plurality of compartments, each of the compartments being configured to receive a wafer carrier, and wherein the control apparatus is dimensioned to fit within one of the plurality of compartments of the container;
an onboard communication interface within the wafer transport vehicle;
an external control system positioned outside the wafer transport vehicle; and
an external database outside the wafer transport vehicle;
wherein the onboard communication interface is configured to:
interface with the control apparatus to receive the environmental parameters detected by the control apparatus,
communicate with the external control system, and
receive control instructions from the external control system to adjust the control apparatus;
wherein the external control system is configured to:
receive the environmental parameters from the onboard communication interface and/or the control apparatus,
analyze and monitor the internal environment of the container, and
send control instructions to the onboard communication interface and/or the control apparatus to adjust the control apparatus;
wherein the external database is configured to:
receive the environmental parameters from the control apparatus.

15. The system of claim 14, wherein the control apparatus is configured to detect a temperature in the container, a humidity level in the container and/or a vibration of the container.

16. The system of claim 14, wherein the control apparatus is configured to regulate a temperature in the container and/or a humidity level in the container.

17. The system of claim 14, wherein the control apparatus is configured to notify a driver of the wafer transport vehicle through the onboard communication interface.

18. The system of claim 14, wherein the control apparatus comprises an air conditioner, and wherein the air conditioner comprises:
an air inlet configured to draw an outside air;
a compressor;
a cooling element connecting to the compressor and configured to condense the air from the air inlet;
a water tank configured to receive a condensate from the air passing through the cooling element;
a heating element connecting to the compressor and configured to heat the air from the cooling element; and
an air outlet configured to exhaust the air from the heating element.

19. The system of claim 14, wherein the control apparatus comprises a temperature sensor configured to detect a temperature in the container of the wafer transport vehicle;
a humidity sensor configured to detect a humidity level in the container of the wafer transport vehicle; and
a vibration sensor is configured to detect a vibration of the container of the wafer transport vehicle.

20. The system of claim 14, wherein the control apparatus comprises a warning device configured to alert a driver of the wafer transport vehicle.

* * * * *